(12) United States Patent
Penumatcha et al.

(10) Patent No.: US 12,349,442 B2
(45) Date of Patent: Jul. 1, 2025

(54) THIN FILM TRANSISTORS HAVING SEMICONDUCTOR STRUCTURES INTEGRATED WITH 2D CHANNEL MATERIALS

(71) Applicant: Intel Corporation, Santa Clara, CA (US)

(72) Inventors: Ashish Verma Penumatcha, Beaverton, OR (US); Uygar E. Avci, Portland, OR (US); Chelsey Dorow, Portland, OR (US); Tanay Gosavi, Portland, OR (US); Chia-Ching Lin, Portland, OR (US); Carl Naylor, Portland, OR (US); Nazila Haratipour, Portland, OR (US); Kevin P. O'Brien, Portland, OR (US); Seung Hoon Sung, Portland, OR (US); Ian A. Young, Olympia, WA (US); Urusa Alaan, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 772 days.

(21) Appl. No.: 17/479,769

(22) Filed: Sep. 20, 2021

(65) Prior Publication Data
US 2023/0090093 A1   Mar. 23, 2023

(51) Int. Cl.
*H10D 64/27* (2025.01)
*H10D 30/01* (2025.01)
(Continued)

(52) U.S. Cl.
CPC .......... *H10D 64/517* (2025.01); *H10D 30/47* (2025.01); *H10D 30/751* (2025.01); *H10D 62/151* (2025.01); *H10D 30/675* (2025.01)

(58) Field of Classification Search
CPC . H01L 29/7782; H01L 29/165; H01L 29/267; H01L 29/1054; H01L 29/778;
(Continued)

(56) References Cited

U.S. PATENT DOCUMENTS 9,147,824 B1 *   9/2015   Cao ................... H01L 21/02485
10,790,356 B2 *  9/2020   Lee ..................... H01L 29/0847
(Continued)

*Primary Examiner* — Sonya McCall-Shepard
(74) *Attorney, Agent, or Firm* — Schwabe, Williamson & Wyatt P.C.

(57) ABSTRACT

Thin film transistors having semiconductor structures integrated with two-dimensional (2D) channel materials are described. In an example, an integrated circuit structure includes a two-dimensional (2D) material layer above a substrate. A gate stack is above the 2D material layer, the gate stack having a first side opposite a second side. A semiconductor structure including germanium is included, the semiconductor structure laterally adjacent to and in contact with the 2D material layer adjacent the first side of the gate stack. A first conductive structure is adjacent the first side of the second gate stack, the first conductive structure over and in direct electrical contact with the semiconductor structure. The semiconductor structure is intervening between the first conductive structure and the 2D material layer. A second conductive structure is adjacent the second side of the second gate stack, the second conductive structure over and in direct electrical contact with the 2D material layer.

20 Claims, 11 Drawing Sheets

(51) Int. Cl.
*H10D 30/47* (2025.01)
*H10D 30/67* (2025.01)
*H10D 30/69* (2025.01)
*H10D 62/10* (2025.01)
*H10D 62/13* (2025.01)
*H10D 62/82* (2025.01)

(58) Field of Classification Search
CPC ........... H01L 29/42372; H01L 29/0847; H01L 29/78681; H01L 29/0623; H01L 29/0657; H01L 29/0665; H01L 29/78603; H01L 29/24; H01L 29/66969; H01L 29/78618; H01L 21/823412; H01L 29/78696; H01L 29/7606; H01L 29/41725; H01L 29/41766; H01L 21/02568; H10D 30/40; H10D 30/47; H10D 30/471; H10D 30/472; H10D 30/473; H10D 30/481; H10D 30/6713; H10D 64/251; H10D 30/6757; H10D 30/751
See application file for complete search history.

(56) References Cited

U.S. PATENT DOCUMENTS

| | | | |
|---|---|---|---|
| 2011/0084284 A1* | 4/2011 | Zhang | H01L 29/267 257/77 |
| 2019/0157272 A1* | 5/2019 | Oishi | H10D 30/6713 |
| 2021/0057524 A1* | 2/2021 | Lin | H01L 29/24 |

\* cited by examiner

THIN FILM TRANSISTORS HAVING SEMICONDUCTOR STRUCTURES INTEGRATED WITH 2D CHANNEL MATERIALS

TECHNICAL FIELD

Embodiments of the disclosure are in the field of integrated circuit structures and, in particular, thin film transistors having semiconductor structures integrated with two-dimensional (2D) channel materials.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g., 13 nm or sub-13 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
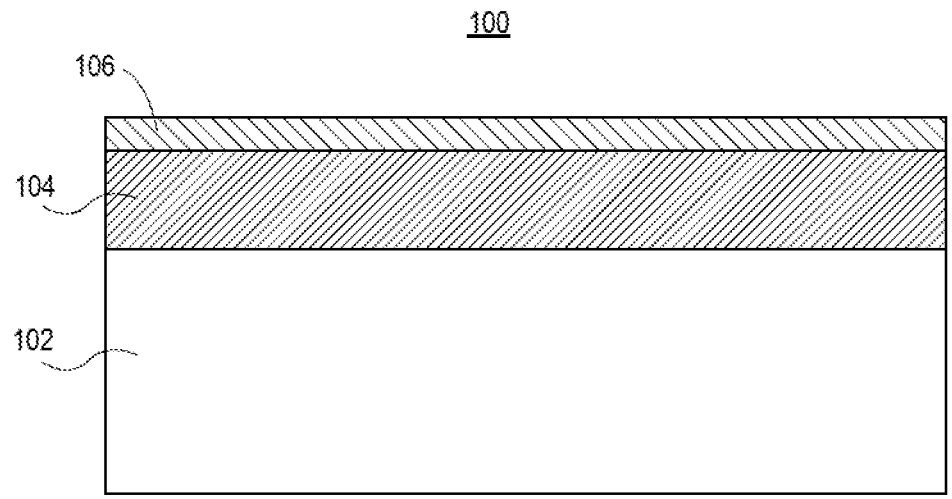
FIGS. 1A-1J illustrate cross-sectional views representing various operations in a method of fabricating an integrated circuit structure having a semiconductor structure integrated with a two-dimensional (2D) channel material, in accordance with an embodiment of the present disclosure.

Thin film transistors having semiconductor structures integrated with two-dimensional (2D) channel materials are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to transition metal dichalcogenide (TMD) transistor integration in a nano-sheet architecture. One or more embodiments described herein are directed to heterostructure TMD tunnel field effect transistors (TFETs) using traditional bulk semiconductors in a source region. Embodiments may include or pertain to one or more of front end transistors, back end transistors, thin film transistors, or system-on-chip (SoC) technologies.

To provide context, in the case that a germanium/transition metal dichalcogenide (Ge/TMD) heterostructure TFET is fabricated by first growing germanium, and then transferring $MoS_2$ on to a Ge source, germanium oxide can be formed in the device. The germanium oxide can reduce on-current. Additionally, there may be no way to provide control over alignment of gate edge to source channel junction.

In accordance with one or more embodiments described herein, a p-i-n structure with gate-controlled p-i junction is described. Embodiments described herein can be implemented to minimize Ge overlap with a gate structure. In one embodiment, $MoS_2$ (TMD) is formed first, since Ge cannot survive the growth temp of high-quality $MoS_2$ growth. A $MoS_2$ thin body helps gate control of the channel at scaled dimensions.

In an embodiment, a process flow fabricating a steep-slope Tunnel FET (SS<60 mV dec) that has TMD material as the channel and a bulk semiconductor as source material is described. Structures described herein can avoid formation of a native oxide at the source to channel interface and can allows for alignment of a gate to the source-channel junction while taking advantage of the mono-layer thickness of the channel that allows for the desired gate control.

Advantages to implementing one or more of the embodiments described herein can include the fabrication of a TFET that allows for sub-60 mV/decade inverse sub-threshold slope. This can allow the voltage to be scaled below 0.4V without sacrificing on-off ratio. Such TFETs can enable the fabrication of low-power cores that have better power-performance trade-off than chips built using standard CMOS.

In an exemplary processing scheme, FIGS. 1A-1J illustrate cross-sectional views representing various operations in a method of fabricating an integrated circuit structure having a semiconductor structure integrated with a two-dimensional (2D) channel material, in accordance with an embodiment of the present disclosure. As an exemplary structure, FIG. 2 illustrates a cross-sectional view representing an integrated circuit structure having a semiconductor structure integrated with a two-dimensional (2D) channel material, in accordance with an embodiment of the present disclosure.

Figure 2:
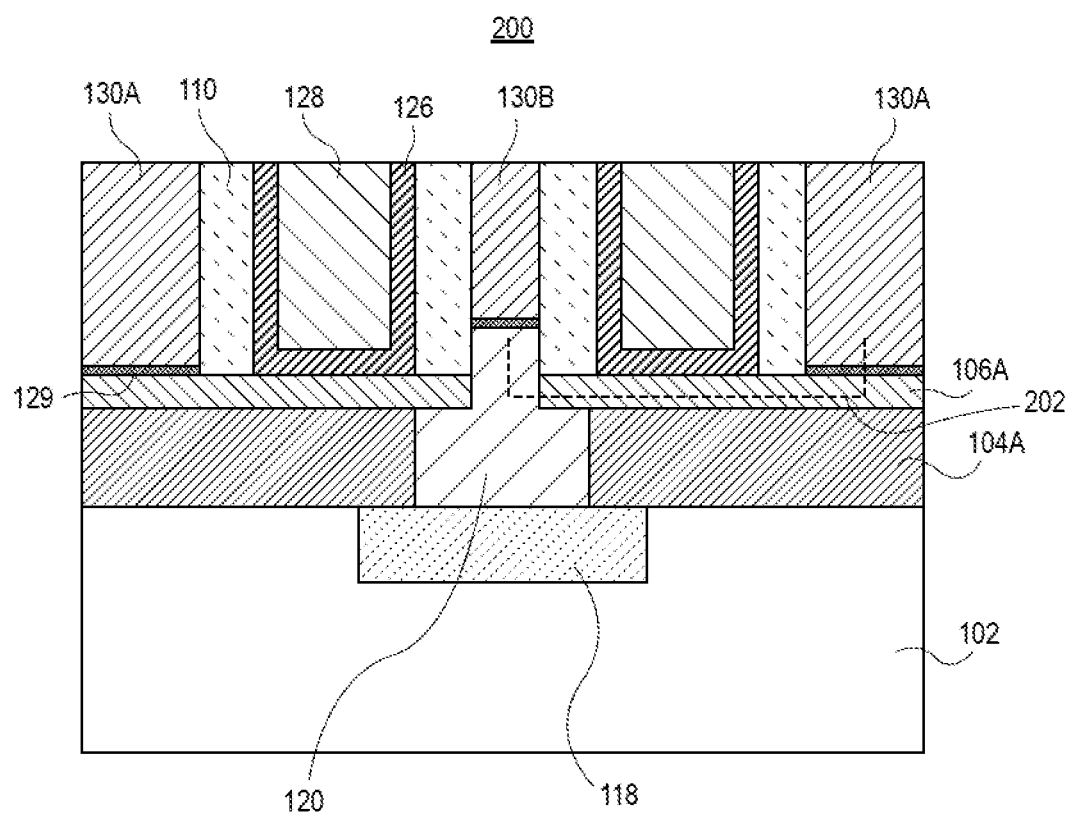
FIG. 2 illustrates a cross-sectional view representing an integrated circuit structure having a semiconductor structure integrated with a two-dimensional (2D) channel material, in accordance with an embodiment of the present disclosure.

Referring to FIG. 1A, a starting structure 100 includes an insulator layer 104 on or above a substrate 102, such as a silicon oxide or silicon nitride insulator layer on or above a silicon substrate. A two-dimensional (2D) material layer 106 is formed on the insulator layer 104.

In an embodiment, the 2D material layer 106 is or includes a transition metal dichalcogenide (TMD) material. In an embodiment, the 2D material layer 106 is composed of a material such as molybdenum sulfide ($MoS_2$), tungsten sulfide ($WS_2$), molybdenum selenide ($MoSe_2$), tungsten selenide ($WSe_2$), molybdenum telluride ($MoTe_2$), or indium selenide (InSe). In an embodiment, the 2D material layer 106 has a thickness in a range of 0.6-5 nanometers.

Figure 1B:
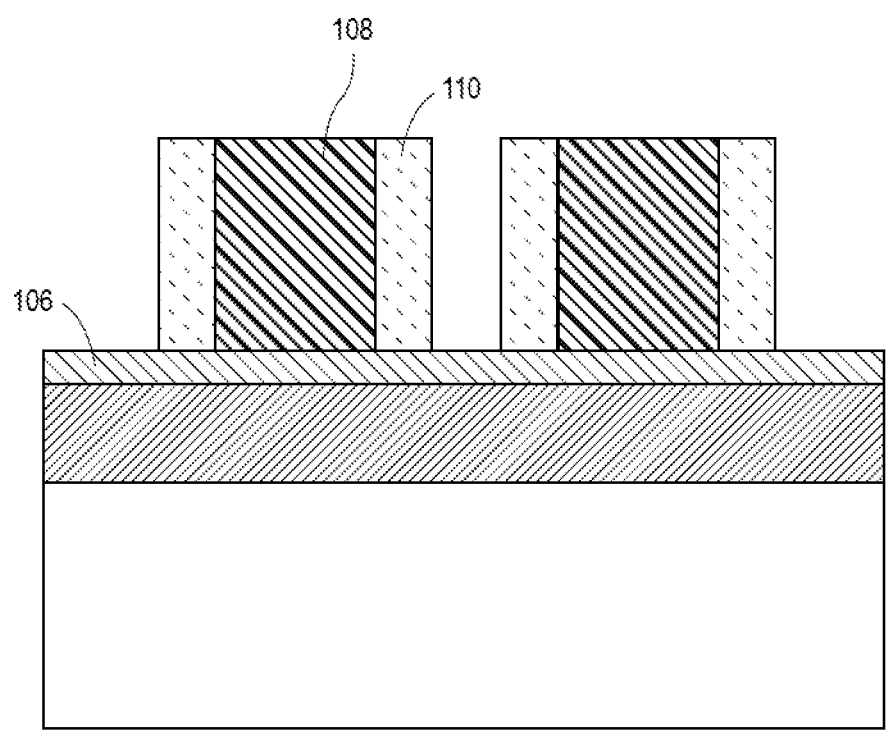

Referring to FIG. 1B, sacrificial structures 108, such as dummy polysilicon gate structures or other dummy gate structures, are formed on the 2D material layer 106, e.g., by a deposition, lithography, and etch process. Dielectric spacers 110, such as silicon nitride spacers, are formed along sides of the sacrificial structures 108, e.g., by a blanket deposition and anisotropic etch process.

Figure 1C:
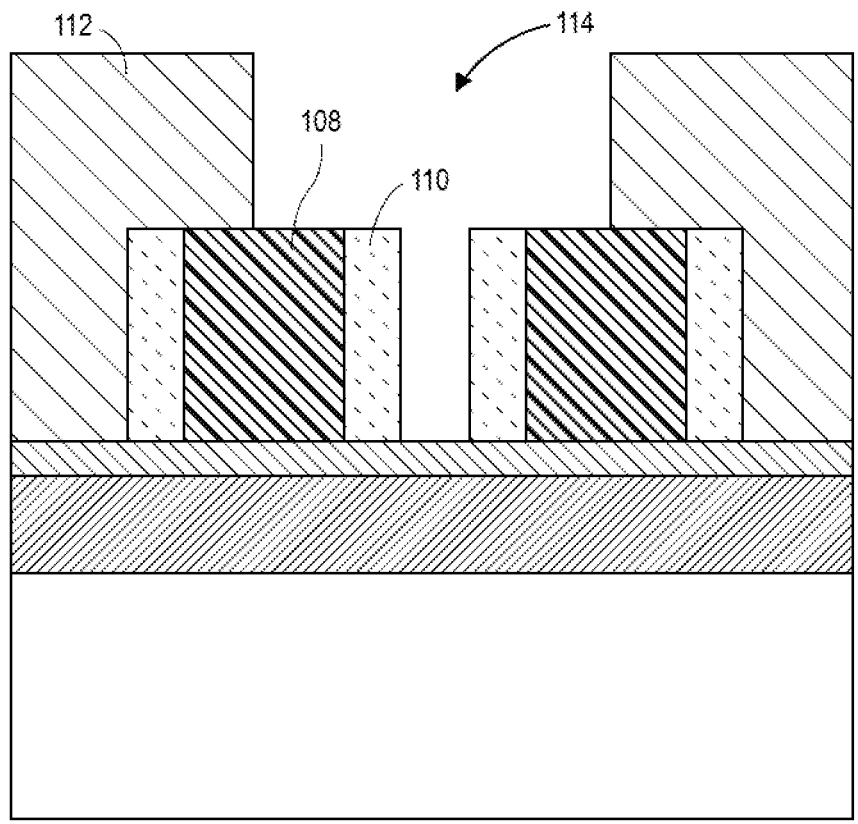

Referring to FIG. 1C, a mask 112 having an opening 114 therein is formed over the structure of FIG. 1B, e.g., by a deposition and lithography process. The mask 112 exposes a region between two adjacent sacrificial structures 108 and their corresponding dielectric spacers 110.

Figure 1D:
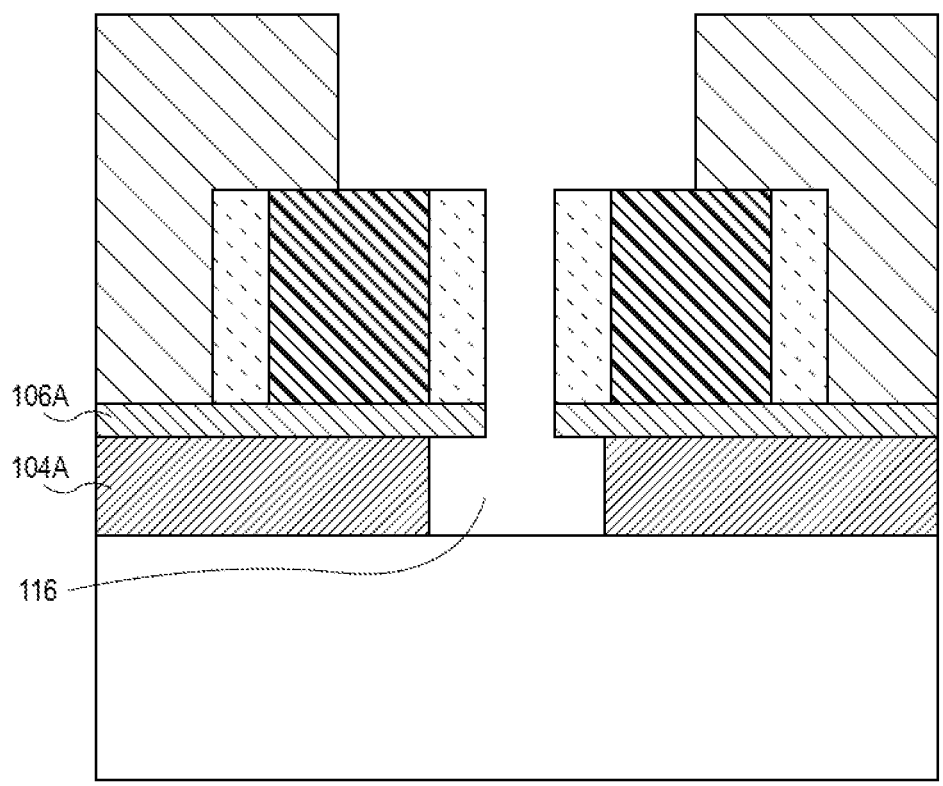

Referring to FIG. 1D, using the mask 112, a cavity 116 is formed in 2D material layer 106 and in insulator layer 104, e.g., by an etch process. The cavity 116 leaves patterned 2D material layer 106A and patterned insulator layer 104A remaining.

Figure 1E:
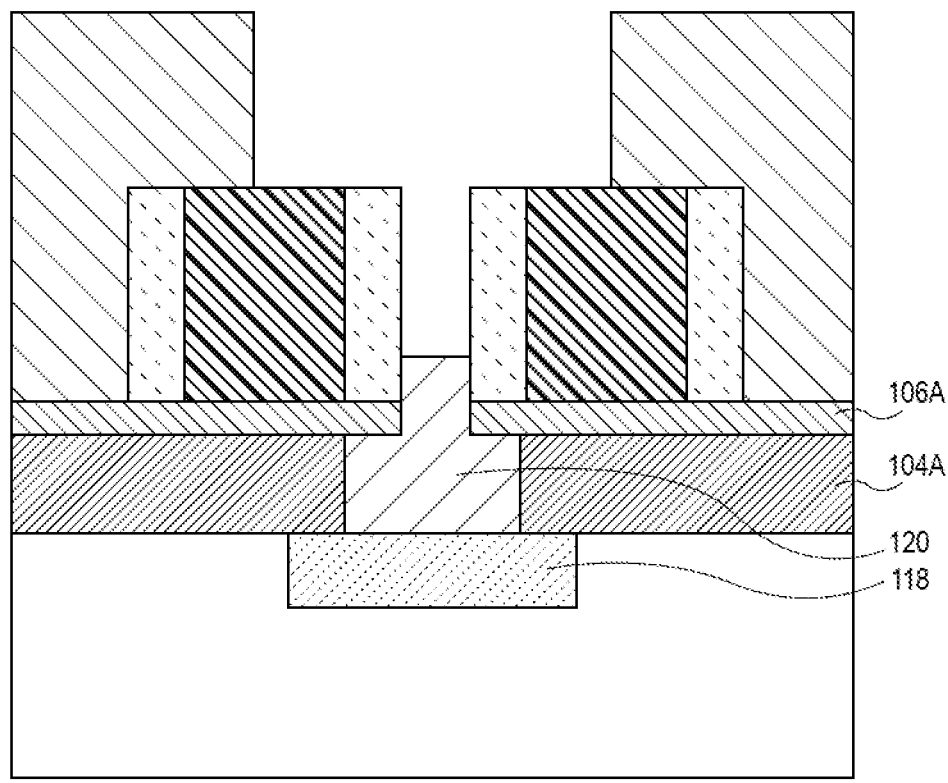

Referring to FIG. 1E, a doped region 118 is formed in a portion of substrate 102 exposed by the cavity 116, e.g., by an implant process. In one embodiment, the doped region 118 is an N+ doped region in a silicon substrate, e.g., having phosphorous dopants, arsenic dopants, or both. A germanium structure 120 is then formed in the cavity 116, e.g., by an epitaxial growth process. In one embodiment, the germanium structure 120 is a P++ doped germanium structure, e.g., having boron dopants.

In an embodiment, as used throughout, germanium structure 120 is composed of a very substantial amount of, if not all, germanium as a semiconductor material. However, it is to be appreciated that, practically, 100% pure Ge may be difficult to form and, hence, could include a tiny percentage of carbon and/or silicon and/or tin. Such impurities may be included as an unavoidable impurity or component during deposition of Ge or may "contaminate" the Ge upon diffusion during post deposition processing. As such, embodiments described herein directed to a germanium structure 120 may include a germanium material that contains a relatively small amount, e.g., "impurity" level, non-Ge atoms or species, such as Si and/or C and/or Sn. It is to be appreciated that a germanium structure 120 as described herein may be doped with dopant atoms such as boron.

Figure 1F:
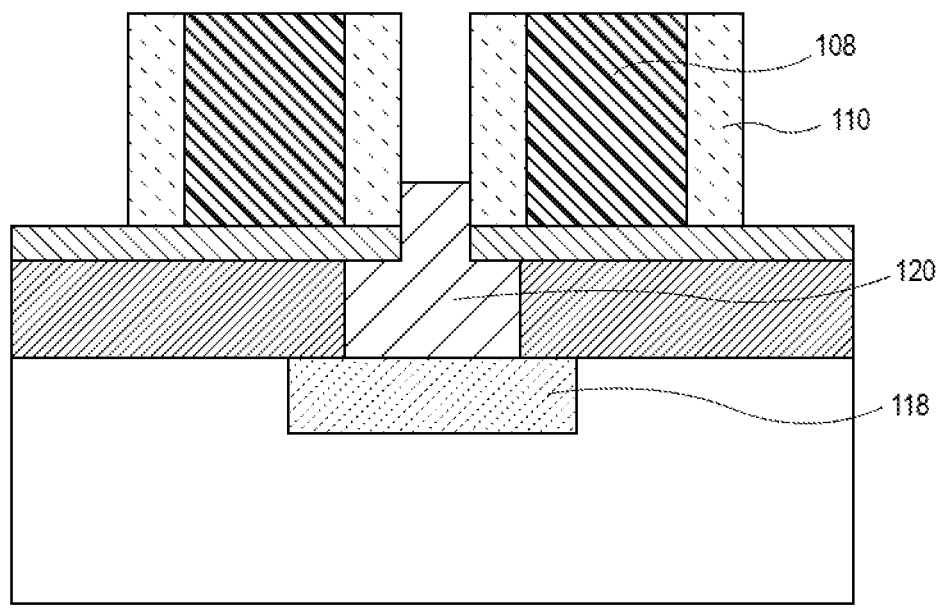

Referring to FIG. 1F, following formation of the germanium structure 120, the mask 112 is removed from the structure of FIG. 1E. In another embodiment, however, mask 112 is removed prior to the formation of the germanium structure 120.

Figure 1G:
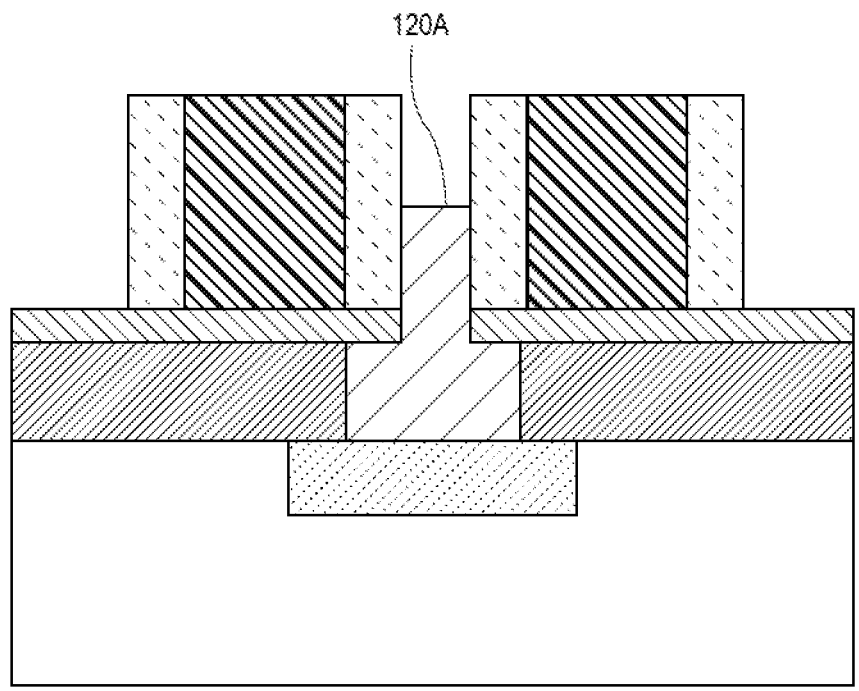

Referring to FIG. 1G, optionally, germanium structure 120 can be modified to form 120A, e.g., to remove any portion damaged upon mask removal, and/or to add additional dopants, and/or to grow additional germanium.

Figure 1H:
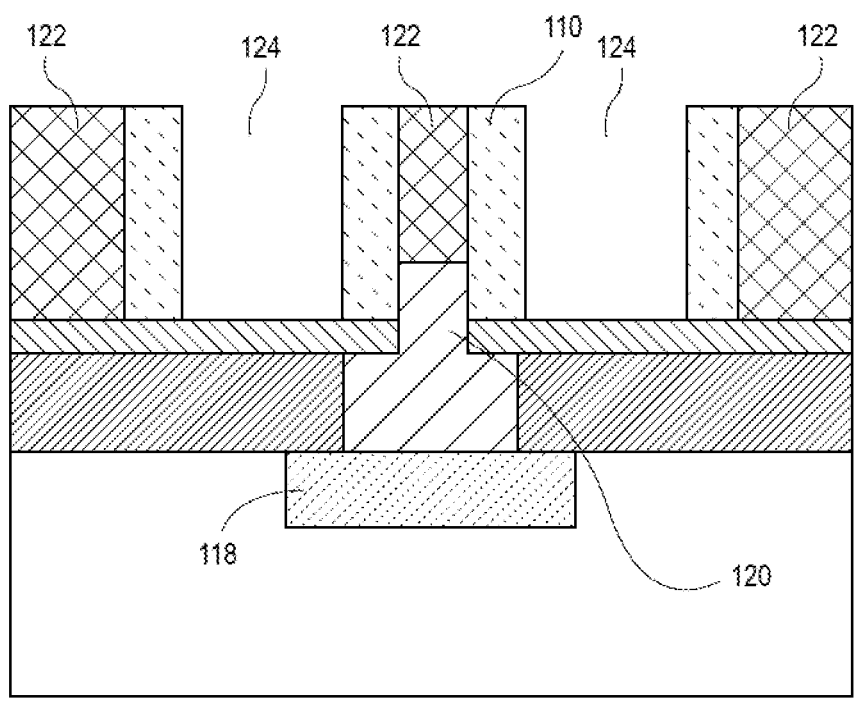

Referring to FIG. 1H, a dielectric layer 122, such as an inter-layer dielectric layer, is formed on the structure of either FIG. 1F (as depicted) or of FIG. 1G, e.g., by a deposition and planarization process. The sacrificial structures 108 are then removed to form open gate locations 124.

Figure 1I:
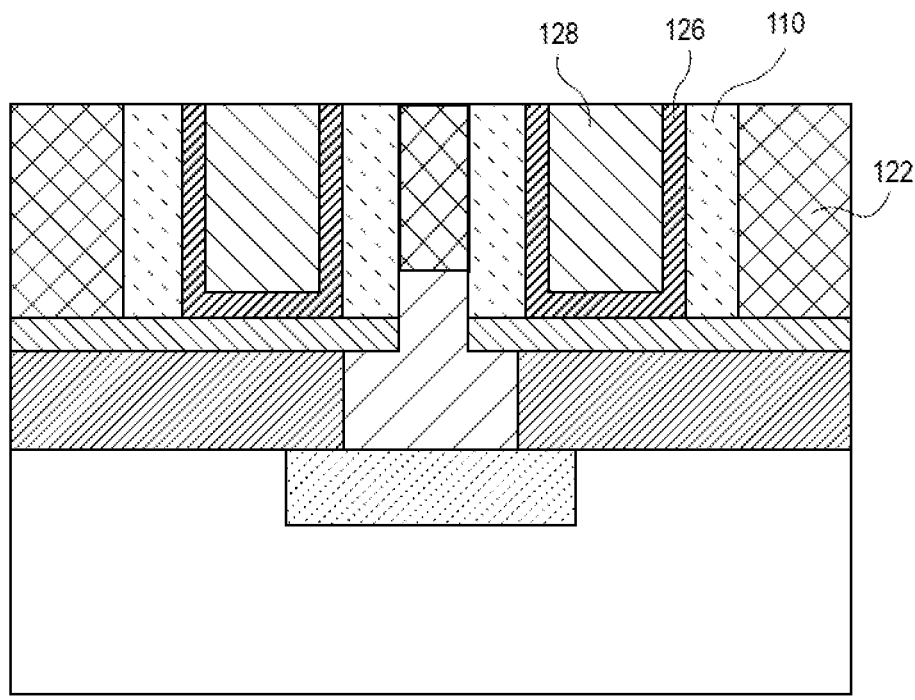

Referring to FIG. 1I, permanent gate structures are formed in the open gate locations 124, e.g., by deposition and planarization processes. The gate structures each include a gate dielectric 126 and gate electrode 128, such as a high-k gate dielectric layer and metal gate electrode.

Figure 1J:
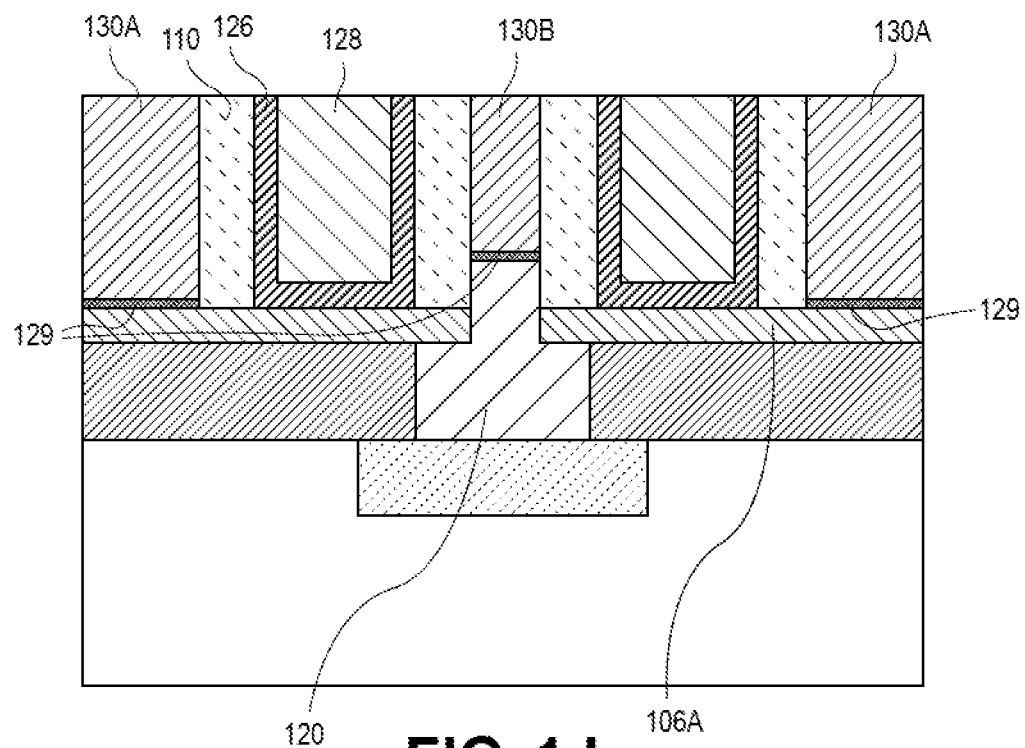

Referring to FIG. 1J, portions of or all of the dielectric layer 122 is removed. Drain structures 130A and a source structure 130B are then formed between the dielectric spacers 110 along the permanent gate structures 126/128, e.g., by a deposition and planarization process and/or by an electrodeposition process and/or by an electroless deposition process. In one embodiments, an interface layer 129 (such as a metal seed layer) is formed on the exposed portions of the patterned 2D material layer 106A and remains between the drain structures 130A/source structure 130B and the patterned 2D material layer 106A. In one embodiment, the drain structures 130A and the source structure 130B include a metal and are conductive structures (as opposed to semiconductor structures). In other embodiments, the drain structures 130A and the source structure 130B are semiconductor structures.

Referring to FIG. 2, an integrated circuit structure 200 is shown as the structure of FIG. 1J with a current path 202 shown from source structure 130B, through the germanium structure 120, through the patterned 2D material layer 106A, and to the drain structure 130A.

With reference again to FIG. 2, in accordance with an embodiment of the present disclosure, an integrated circuit structure 200 includes a two-dimensional (2D) material layer 106A above a substrate 102. A gate stack 126/128 is above the 2D material layer 106A, the gate stack having a first side opposite a second side. The integrated circuit structure 200 includes a semiconductor structure 120 including germanium. The semiconductor structure 120 is laterally adjacent to and in contact with the 2D material layer 106A adjacent the first side of the gate stack 126/128. A first conductive structure 130B is adjacent the first side of the second gate stack 126/128. The first conductive structure 130B is over and is in direct electrical contact with the semiconductor structure 120 (this can be the case with or without an interface layer 129). The semiconductor structure 120 is intervening between the first conductive structure 130B and the 2D material layer 106A (e.g., inhibiting direct contact between the two). A second conductive structure 130A is adjacent the second side of the second gate stack 126/128. The second conductive structure 130A is over and is in direct electrical contact with the 2D material layer 106A (this can be the case with or without an interface layer 129).

In an embodiment, the semiconductor structure 120 extends from a location below the 2D material layer 106A to a location above the 2D material layer 106A, as is depicted. In an embodiment, the semiconductor structure 120 is a P-type semiconductor structure. In an embodiment, the gate stack 126/128 includes a high-k gate dielectric layer directly on the 2D material layer 106A.

In an embodiment, the 2D material layer 106A includes a sulfide material selected from the group consisting of molybdenum sulfide ($MoS_2$) and tungsten sulfide ($WS_2$). In another embodiment, the 2D material layer 106A includes a selenide material selected from the group consisting of molybdenum selenide ($MoSe_2$), tungsten selenide ($WSe_2$), and indium selenide (InSe), or includes $MoTe_2$.

In another aspect, thin film transistors having a relatively thick body may not exhibit good electrostatic gate control. Furthermore, a passivation layer on a bottom of a TFT may cause interactions leading to undesirable doping which may increase OFF-state leakage and degrade subthreshold swing of a TFT device. In accordance with one or more embodiments of the present disclosure, a second gate is introduced on a bottom of a channel material layer of a TFT in order to control the channel closest to the bottom interface. Such embodiments may be implemented to improve overall electrostatics and ON/OFF ratio for the TFT device.

Figure 3A:
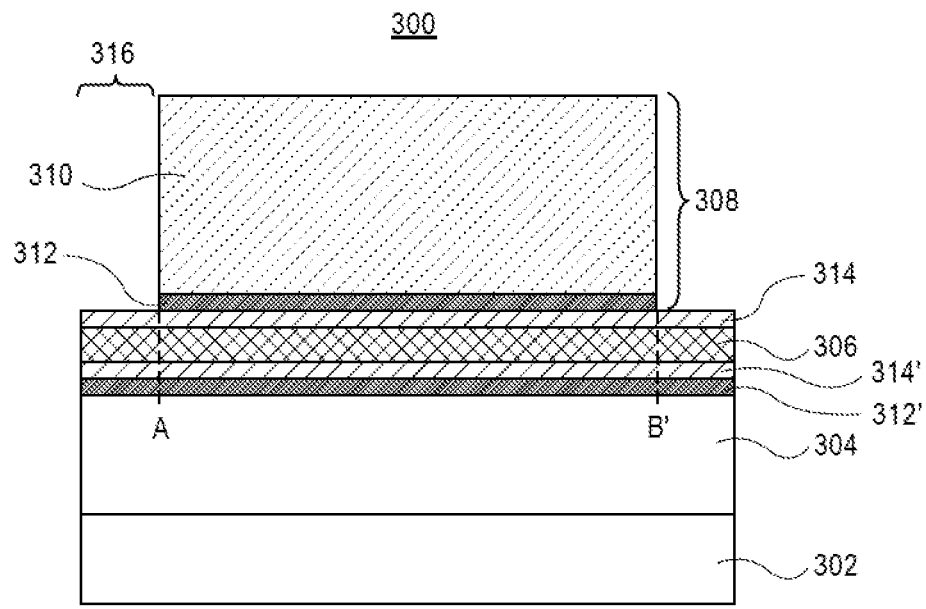
FIG. 3A illustrates a cross-sectional view taken along a gate "width" of a planar double gate thin film transistor (TFT), in accordance with an embodiment of the present disclosure.

As an exemplary structure, FIG. 3A illustrates a cross-sectional view taken along a gate "width" of a planar double gate thin film transistor (TFT), in accordance with an embodiment of the present disclosure.

Referring to FIG. 3A, a planar double gated TFT 300 is formed above a substrate 302, e.g., on an insulating layer 304 above a substrate 302, as is shown. The planar double gated TFT 300 includes a channel material 306, such as a 2D material (e.g., $MoS_2$, $WS_2$, $MoSe_2$, $WSe_2$, $MoTe_2$, or InSe). The 2D material of the channel material layer 306 can be integrated with a semiconductor structure such as described above, e.g., to form a tunnel FET device. An upper gate electrode 308 is formed on a gate dielectric layer 314 formed on the channel material 306. The upper gate electrode 308 may include a fill material 310 on a workfunction layer 312, as is depicted. The upper gate electrode 308 may expose regions 316 of the channel material 306 and the gate dielectric layer 314, as is depicted. Alternatively, the channel material 306 and the gate dielectric layer 314 have a same lateral dimension as the gate electrode 308. A lower gate electrode 312' is on the insulating layer 304 below the channel material 306. A gate dielectric layer 314' is between the channel material 306 and the lower gate electrode 312'.

In an embodiment, the gate dielectric layers 314 and 314' are composed of a same material. In an embodiment, gate electrodes 312 and 312' are composed of a same material. It is to be appreciated that source or drain regions are into and out of the page of the view of FIG. 3A.

In another aspect, in accordance with one or more embodiments described herein, non-planar BEOL-compatible double gated thin film transistors (TFTs) are fabricated by effectively increasing the transistor width (and hence the drive strength and performance) for a given projected area. A double gated TFT fabricated using such an architecture may exhibit an increase in gate control, stability, and performance of thin film transistors. Applications of such systems may include, but are not limited to, back-end-of-line (BEOL) logic, memory, or analog applications. Embodiments described herein may include non-planar structures that effectively increase transistor width (relative to a planar device) by integrating the devices in unique architectures.

The planar double gated TFT 300 has an effective gate width that is the length of the planar channel material 306 between locations A and B', as depicted in FIG. 3A. By contrast, as a first example of a structure having a relative increase in transistor width (e.g., relative to the structure of FIG. 3A), FIG. 3B illustrates a cross-sectional view taken along a gate "width" of a non-planar double gate thin film transistor (TFT), in accordance with an embodiment of the present disclosure.

Figure 3B:
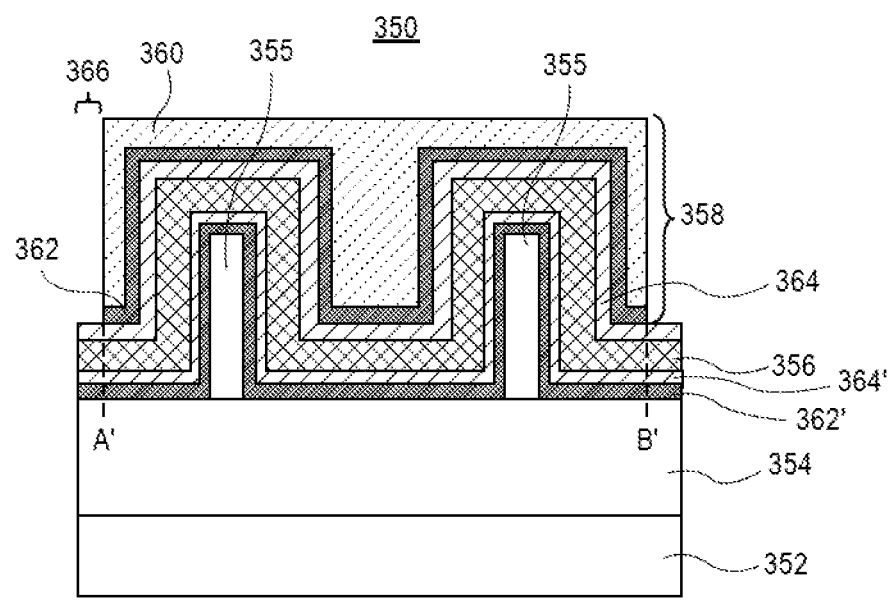
FIG. 3B illustrates a cross-sectional view taken along a gate "width" of a non-planar double gate thin film transistor (TFT), in accordance with an embodiment of the present disclosure.

Referring to FIG. 3B, a non-planar double gated TFT 350 is formed above a substrate 352, e.g., on an insulating layer 354 above a substrate 352, as is shown. A pair of dielectric fins 355 is on the insulating layer 354. The non-planar double gated TFT 350 includes a channel material layer 356, such as a 2D material (e.g., $MoS_2$, $WS_2$, $MoSe_2$, $WSe_2$, $MoTe_2$, or InSe). The 2D material of the channel material layer 356 can be integrated with a semiconductor structure such as described above, e.g., to form a tunnel FET device. The channel material layer 356 is conformal with a lower gate stack conformal with the pair of dielectric fins 355 and with exposed portions of the insulating layer 354 between the pair of dielectric fins 355. The lower gate stack includes gate electrode 362' and gate dielectric layer 364'. An upper gate electrode 358 is on a gate dielectric layer 364 on the channel material layer 356. The upper gate electrode 358 may include a fill material 360 on a workfunction layer 362, as is depicted. The upper gate electrode 358 may expose regions 366 of the channel material layer 356 and the gate dielectric layer 364, as is depicted. Alternatively, the channel material layer 356 and the gate dielectric layer 364 have a same lateral dimension as the gate electrode 358.

In an embodiment, the gate dielectric layers 364 and 364' are composed of a same material. In an embodiment, gate electrodes 362 and 362' are composed of a same material. It is to be appreciated that source or drain regions are into and out of the page of the view of FIG. 3B.

The non-planar double gated TFT 350 has an effective gate width that is the length of the conformal semiconducting oxide channel material layer 356 between locations A' and B', i.e., the full length including undulating portions over the tops and sidewalls of the dielectric fins 355, as is depicted in FIG. 3B. In comparison to FIG. 3A, the structure of FIG. 3B highlights the advantage of a non-planar architecture to increase effective gate width, referred to herein as a relatively increased width.

Figure 3C:
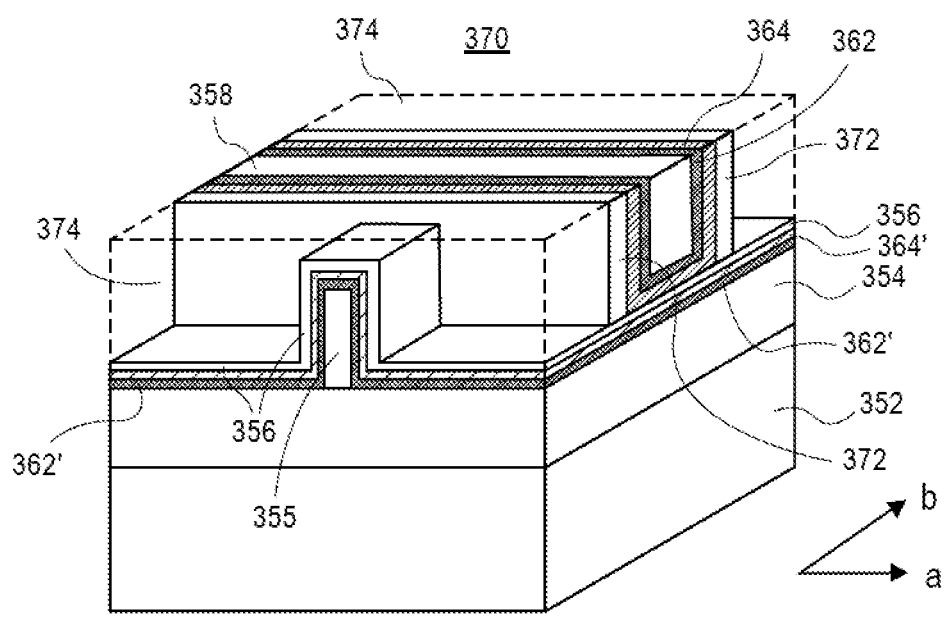
FIGS. 3C, 3D, and 3E illustrate angled and direct cross-sectional views of a non-planar double gate thin film transistor (TFT), in accordance with an embodiment of the present disclosure.
Figure 3D:
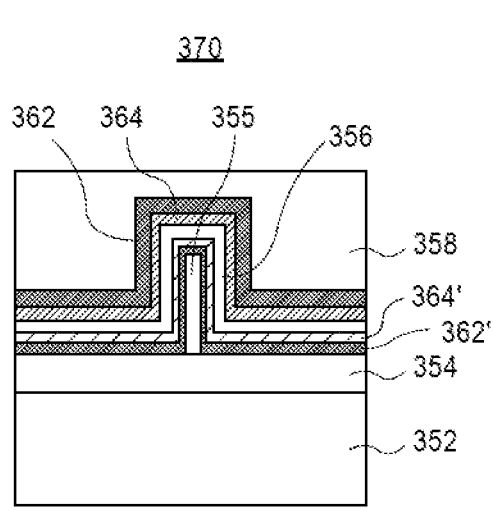
Figure 3E:
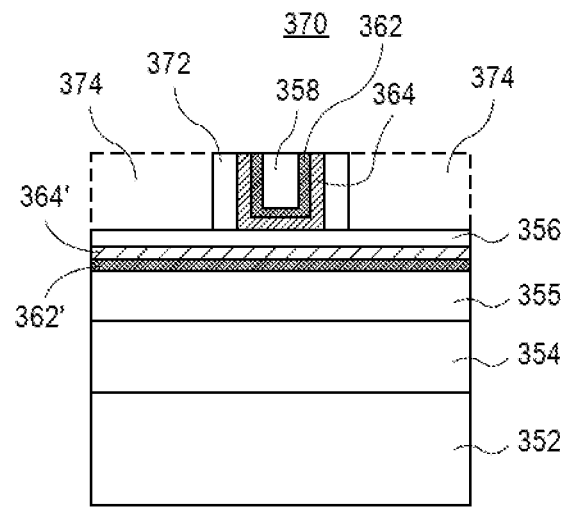

To highlight other aspects of a non-planar double gated TFT topography, FIGS. 3C, 3D (taken at gate cut along a-axis), and 3E (taken at insulating fin cut along b-axis) illustrate angled and direct cross-sectional views of a non-planar double gate thin film transistor (TFT), in accordance with an embodiment of the present disclosure. It is to be appreciated that one dielectric fin is illustrated in FIGS. 3C-3E for simplification. Embodiments may include a single device fabricated over one (FIG. 3C), two (FIG. 3B) or more such dielectric fins. In each case, a 2D channel material layer of the device can be integrated with a semiconductor structure such as described above, e.g., to form a tunnel FET device.

Referring to FIGS. 3C, 3D and 3E, an integrated circuit structure 370 includes an insulator structure 354 above a substrate 352, the insulator structure 354 having one or more fins 355, individual ones of the fins 355 having a top and sidewalls. A first gate stack 362'/364' is on and conformal with the insulator structure 354/355. A channel material layer 356 is on and conformal with the first gate stack 362'/364'. A second gate stack 362/364 is on a first portion of the channel material layer 356, the second gate stack 362/364 having a first side (front or left) opposite a second side (back or right). A first conductive contact (front or left 374) is adjacent the first side of the second gate stack 362/364, the first conductive contact (front or left 374) on a second portion of the channel material layer 356. A second conductive contact (back or right 374) is adjacent the second side of the second gate stack 362/364, the second conductive contact (back or right 374) on a third portion of the channel material layer 356.

In an embodiment, a gate electrode 362' of the first gate stack 362'/364' is electrically coupled to a gate electrode 362 of the second gate stack 362/364, e.g., they may share a common contact or interconnect (not shown). In another embodiment, as shown, a gate electrode 362' of the first gate stack 362'/364' is electrically independent from a gate electrode 362 of the second gate stack 362/364.

In an embodiment, the first gate stack 362'/364' includes a first high-k gate dielectric layer 364' between the channel material layer 356 and a gate electrode 362' of the first gate stack 362'/364'. The second gate stack 362/364 includes a second high-k gate dielectric layer 364 between the channel material layer 356 and a gate electrode 362 of the second gate stack 362/364. In an embodiment, gate electrodes 362 and 362' are or include metal gate electrodes.

In an embodiment, the integrated circuit structure 370 further includes a first dielectric spacer (front or left 372) between the first conductive contact (front or left 374) and the first side of the second gate stack 362/364. The first dielectric spacer (front or left 372) is over a fourth portion of the channel material layer 356. A second dielectric spacer (back or right 372) is between the second conductive contact (back or right 374) and the second side of the second gate stack 362/364. The second dielectric spacer (back or right 372) is over a fifth portion of the channel material layer 356.

In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 355 each have squared-off (as shown) or rounded corners.

In accordance with an embodiment of the present disclosure, the above TFT double gate non-planar architectures 350 and 370 provide for higher effective widths for a transistor for a scaled projected area. In an embodiment, the drive strength and performance of such transistors are improved over state-of-the-art planar BEOL transistors.

Thus, in accordance with one or more embodiment of the present disclosure, three dimensional (3D) double gated tunnel field effect transistors (TFETs) having increased gate width are described. In an embodiment, such double gated FETs are based on a channel material including a 2D material (e.g., $MoS_2$, $WS_2$, $MoSe_2$, $WSe_2$, $MoTe_2$, or InSe). The 2D material can be integrated with a semiconductor structure, such as described above.

To provide further context, it is to be appreciated that conventional transistors often require high voltages to write the memory in 1T1R arrangements. Such a requirement may be challenging for low Vcc eNVM. A tunnel-FET can accommodate for such Vcc issues, but the drive current is typically low. In accordance with one or more embodiments described herein, addressing one or more of the above issues, a three-dimensional (3D) double gated tunnel FET is described. The 3D double gated tunnel FET may be used as a selector for eNVM applications. In an embodiment, a 3D double gated tunnel FET described herein has high drive due to increased gate width relative to a counterpart planar device.

It is to be appreciated that in some embodiments the layers and materials described in association with embodiments herein are typically formed on or above an underlying semiconductor substrate, e.g., as FEOL layer(s). In other embodiments, the layers and materials described in association with embodiments herein are formed on or above underlying device layer(s) of an integrated circuit, e.g., as BEOL layer(s) above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back-end-of-line (BEOL) interconnect layers.

In the case that an insulator layer is optionally used, the insulator layer may be composed of a material suitable to ultimately electrically isolate, or contribute to the isolation of, portions of a gate structure from an underlying bulk substrate or interconnect layer. For example, in one embodiment, the insulator layer is composed of a dielectric material such as, but not limited to, silicon dioxide, silicon oxy-nitride, silicon nitride, carbon-doped silicon nitride, aluminum oxide, or aluminum nitride. In a particular embodiment, the insulator layer is a low-k dielectric layer of an underlying BEOL layer.

In an embodiment, a channel material layer of a TFT is or includes a 2D material (e.g., $MoS_2$, $WS_2$, $MoSe_2$, $WSe_2$, $MoTe_2$, or InSe). The 2D material of layer can be formed together with a lower hexagonal boron nitride (hBN) layer, an upper hBN layer, or both a lower hBN layer and an upper hBN layer. In an embodiment, the channel material layer has a thickness between 0.5 nanometers and 10 nanometers.

In an embodiment, gate electrodes described herein include at least one P-type work function metal or N-type work function metal, depending on whether the integrated circuit device is to be included in a P-type transistor or an N-type transistor. For a P-type transistors, metals that may be used for the gate electrode may include, but are not limited to, ruthenium, palladium, platinum, cobalt, nickel, and conductive metal oxides (e.g., ruthenium oxide). For an N-type transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layers described herein are composed of a high-k material. For example, in one embodiment, a gate dielectric layer is composed of a material such as, but not limited to, hafnium oxide, hafnium oxy-nitride, hafnium silicate, lanthanum oxide, zirconium oxide, zirconium silicate, hafnium zirconium oxide, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric may consist of a "U"-shaped structure that includes a bottom portion substantially parallel to the surface of the substrate and two sidewall portions that are substantially perpendicular to the top surface of the substrate.

In an embodiment, dielectric spacers are formed from a material such as silicon nitride, silicon oxide, silicon carbide, silicon nitride doped with carbon, silicon oxynitride, and aluminum nitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode.

In an embodiment, conductive contacts act as contacts to source or drain regions of a TFT, or act directly as source or drain regions of the TFT. The conductive contacts may be spaced apart by a distance that is the gate length of the transistor. In some embodiments, the gate length is between 2 and 30 nanometers. In an embodiment, the conductive contacts include one or more layers of metal and/or metal alloys.

In an embodiment, interconnect lines (and, possibly, underlying via structures), such as interconnect lines, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment, ILD materials described herein are composed of or include a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, aluminum oxide, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer, particularly upper gate stacks, may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of SF$_6$. In another embodiment, dummy gates are composed of polycrystalline silicon or amorphous silicon and are removed with a wet etch process including use of aqueous NH$_4$OH or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, the integrated circuit structures described herein may be included in an electronic device. As a first example of an apparatus that may include one or more of the TFTs disclosed herein, FIGS. 4 and 5 are top views of a wafer and dies that include one or more thin film transistors having semiconductor structures integrated with two-dimensional (2D) channel materials, in accordance with any of the embodiments disclosed herein.

Figure 5:
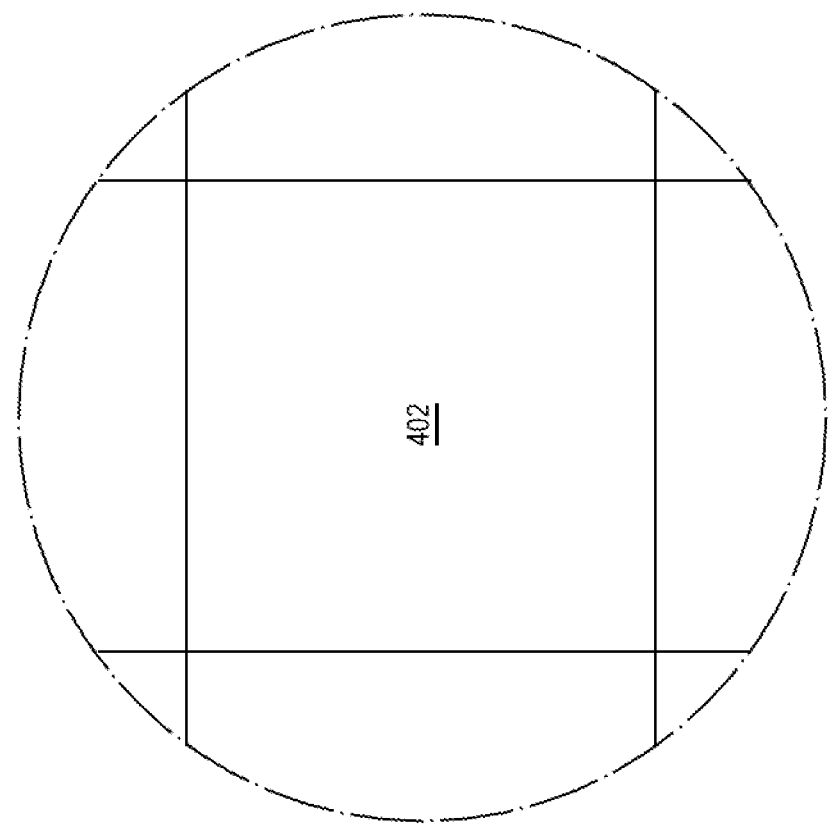
FIGS. 4 and 5 are top views of a wafer and dies that include one or more thin film transistors having semiconductor structures integrated with two-dimensional (2D) channel materials, in accordance with one or more of the embodiments disclosed herein.
Figure 4:
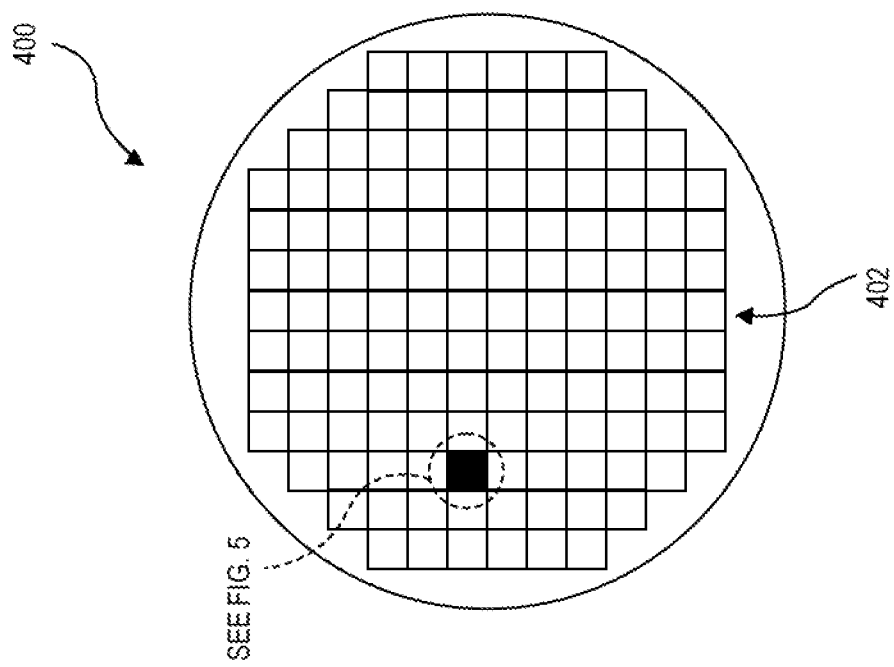

Referring to FIGS. 4 and 5, a wafer 400 may be composed of semiconductor material and may include one or more dies 402 having integrated circuit (IC) structures formed on a surface of the wafer 400. Each of the dies 402 may be a repeating unit of a semiconductor product that includes any suitable IC (e.g., ICs including one or more structures such as structures such as described above). After the fabrication of the semiconductor product is complete (e.g., after manufacture of structures such as described above), the wafer 400 may undergo a singulation process in which each of the dies 402 is separated from one another to provide discrete "chips" of the semiconductor product. In particular, devices that include TFT as disclosed herein may take the form of the wafer 400 (e.g., not singulated) or the form of the die 402 (e.g., singulated). The die 402 may include one or more transistors and/or supporting circuitry to route electrical signals to the transistors, as well as any other IC components. In some embodiments, the wafer 400 or the die 402 may include a memory device (e.g., a static random access memory (SRAM) device), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processing device or other logic that is configured to store information in the memory devices or execute instructions stored in the memory array.

Figure 6:
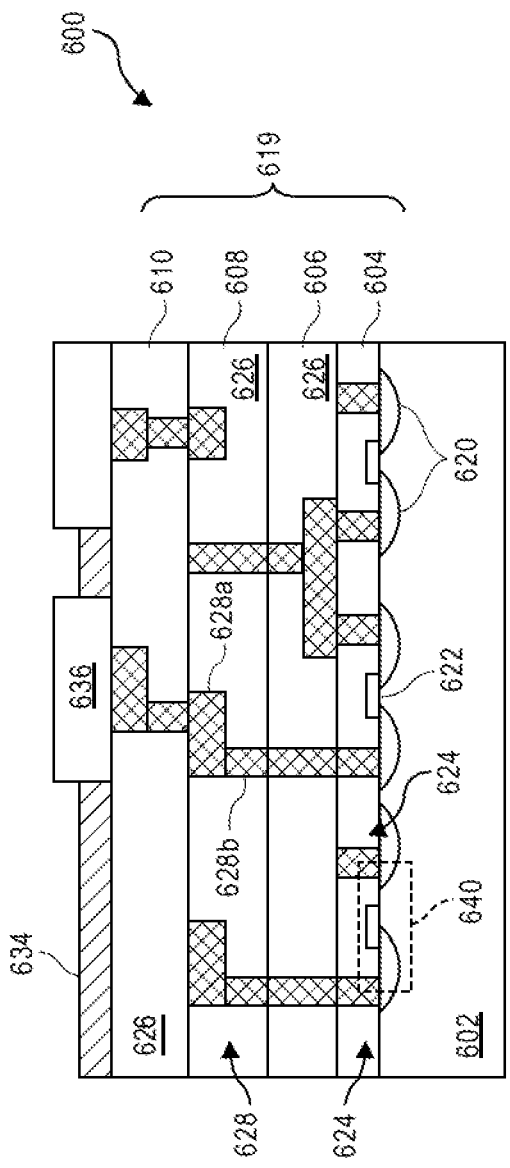
FIG. 6 is a cross-sectional side view of an integrated circuit (IC) device that may include one or more thin film transistors having semiconductor structures integrated with two-dimensional (2D) channel materials, in accordance with one or more of the embodiments disclosed herein.

FIG. 6 is a cross-sectional side view of an integrated circuit (IC) device that may include one or more thin film transistors having semiconductor structures integrated with two-dimensional (2D) channel materials, in accordance with one or more of the embodiments disclosed herein.

Referring to FIG. 6, an IC device 600 is formed on a substrate 602 (e.g., the wafer 400 of FIG. 4) and may be included in a die (e.g., the die 402 of FIG. 5), which may be singulated or included in a wafer. Although a few examples of materials from which the substrate 602 may be formed are described above, any material that may serve as a foundation for an IC device 600 may be used.

The IC device 600 may include one or more device layers, such as device layer 604, disposed on the substrate 602. The device layer 604 may include features of one or more transistors 640 (e.g., TFTs described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 640 take the form of the transistors such as described above. Thin-film transistors such as described above may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
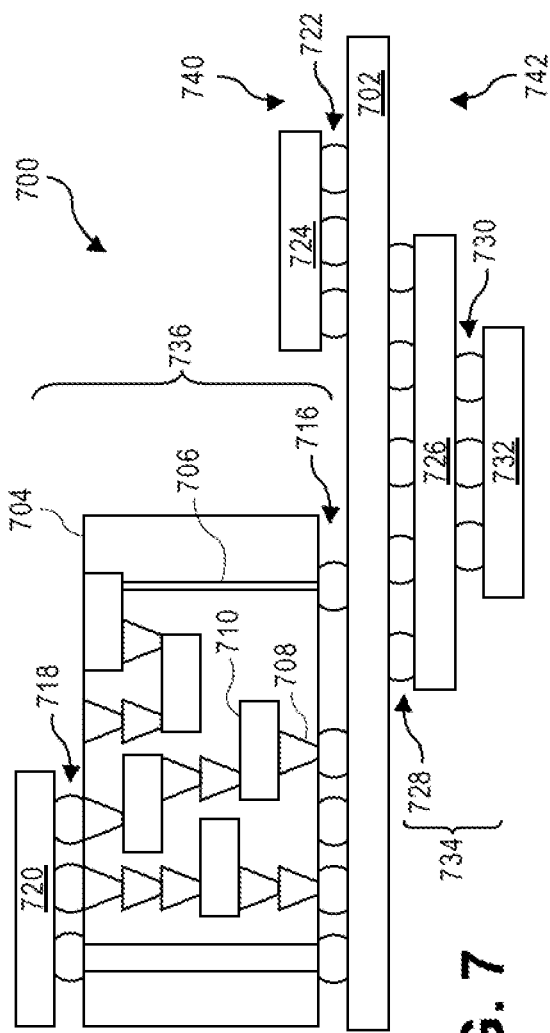
FIG. 7 is a cross-sectional side view of an integrated circuit (IC) device assembly that may include one or more thin film transistors having semiconductor structures integrated with two-dimensional (2D) channel materials, in accordance with one or more of the embodiments disclosed herein.

FIG. 7 is a cross-sectional side view of an integrated circuit (IC) device assembly that may include one or more thin film transistors having semiconductor structures integrated with two-dimensional (2D) channel materials, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 402 of FIG. 5), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
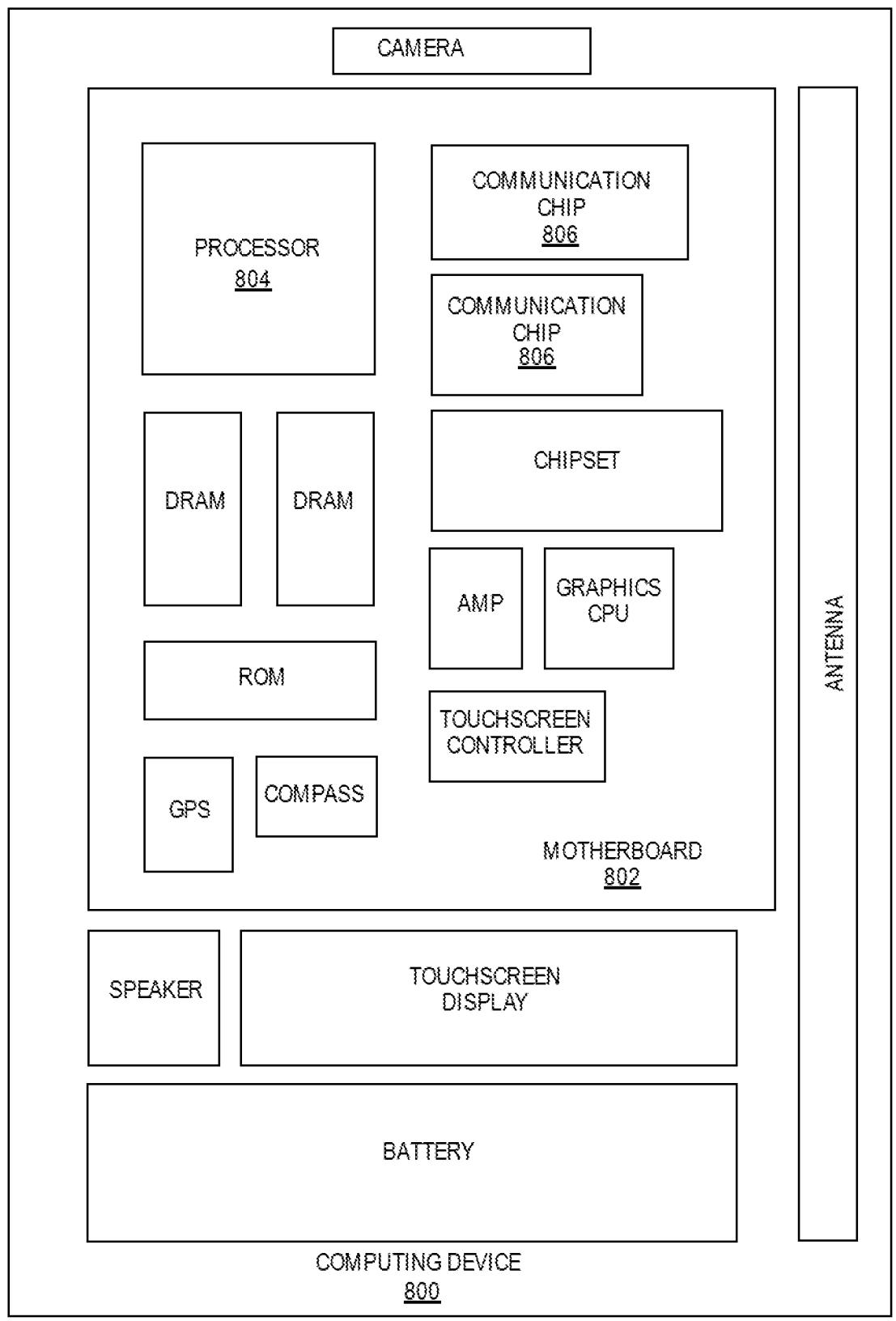
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more thin film transistors having semiconductor structures integrated with two-dimensional (2D) channel materials, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film transistors having semiconductor structures integrated with two-dimensional (2D) channel materials, in accordance with implementations of embodiments of the disclosure.

In further implementations, another component housed within the computing device 800 may contain an integrated circuit die that includes one or more thin film transistors having semiconductor structures integrated with two-dimensional (2D) channel materials, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include thin film transistors having semiconductor structures integrated with two-dimensional (2D) channel materials.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a two-dimensional (2D) material layer above a substrate. A gate stack is above the 2D material layer, the gate stack having a first side opposite a second side. A semiconductor structure including germanium is included, the semiconductor structure laterally adjacent to and in contact with the 2D material layer adjacent the first side of the gate stack. A first conductive structure is adjacent the first side of the second gate stack, the first conductive structure over and in direct electrical contact with the semiconductor structure. The semiconductor structure is intervening between the first conductive structure and the 2D material layer. A second conductive structure is adjacent the second side of the second gate stack, the second conductive structure over and in direct electrical contact with the 2D material layer.

Example embodiment 2: The integrated circuit structure of example embodiment 1, wherein the semiconductor structure extends from a location below the 2D material layer to a location above the 2D material layer.

Example embodiment 3: The integrated circuit structure of example embodiment 1 or 2, wherein the semiconductor structure is a P-type semiconductor structure.

Example embodiment 4: The integrated circuit structure of example embodiment 1, 2 or 3, wherein the gate stack including a high-k gate dielectric layer directly on the 2D material layer.

Example embodiment 5: The integrated circuit structure of example embodiment 1, 2, 3 or 4, wherein the 2D material layer includes a sulfide material selected from the group consisting of molybdenum sulfide ($MoS_2$) and tungsten sulfide ($WS_2$).

Example embodiment 6: The integrated circuit structure of example embodiment 1, 2, 3 or 4, wherein the 2D material layer includes a selenide material selected from the group consisting of molybdenum selenide ($MoSe_2$), tungsten selenide ($WSe_2$), and indium selenide (InSe), or includes $MoTe_2$.

Example embodiment 7: An integrated circuit structure includes a transition metal dichalcogenide (TMD) channel layer on an insulator layer on a silicon substrate. A gate stack is above the TMD channel layer, the gate stack having a first side opposite a second side, and the gate stack including a high-k gate dielectric layer directly on the TMD channel layer. A structure including germanium and boron is included, the structure laterally adjacent to and in contact with the TMD channel layer adjacent the first side of the gate stack, the structure in a cavity in the insulator layer, and the structure on an N+ doped region of the silicon substrate. A source structure is adjacent the first side of the second gate stack, the source structure over and in direct electrical contact with the structure including germanium and boron, but not in direct electrical contact with the TMD channel layer. A drain structure is adjacent the second side of the second gate stack, the drain structure over and in direct electrical contact with the TMD channel layer.

Example embodiment 8: The integrated circuit structure of example embodiment 7, wherein the structure including germanium and boron extends from a location below the TMD channel layer to a location above the TMD channel layer.

Example embodiment 9: The integrated circuit structure of example embodiment 7 or 8, wherein the TMD channel layer includes a sulfide material selected from the group consisting of molybdenum sulfide ($MoS_2$) and tungsten sulfide ($WS_2$).

Example embodiment 10: The integrated circuit structure of example embodiment 7 or 8, wherein the TMD channel layer includes a selenide material selected from the group consisting of molybdenum selenide ($MoSe_2$), tungsten selenide ($WSe_2$), and indium selenide (InSe), or includes $MoTe_2$.

Example embodiment 11: A computing device includes a board, and a component coupled to the board. The component includes an integrated circuit structure including a two-dimensional (2D) material layer above a substrate. A gate stack is above the 2D material layer, the gate stack having a first side opposite a second side. A semiconductor structure including germanium is included, the semiconductor structure laterally adjacent to and in contact with the 2D material layer adjacent the first side of the gate stack. A first conductive structure is adjacent the first side of the second gate stack, the first conductive structure over and in direct electrical contact with the semiconductor structure. The semiconductor structure is intervening between the first conductive structure and the 2D material layer. A second conductive structure is adjacent the second side of the second gate stack, the second conductive structure over and in direct electrical contact with the 2D material layer.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure including a transition metal dichalcogenide (TMD) channel layer on an insulator layer on a silicon substrate. A gate stack is above the TMD channel layer, the gate stack having a first side opposite a second side, and the gate stack including a high-k gate dielectric layer directly on the TMD channel layer. A structure including germanium and boron is included, the structure laterally adjacent to and in contact with the TMD channel layer adjacent the first side of the gate stack, the structure in a cavity in the insulator layer, and the structure on an N+ doped region of the silicon substrate. A source structure is adjacent the first side of the second gate stack, the source structure over and in direct electrical contact with the structure including germanium and boron, but not in direct electrical contact with the TMD channel layer. A drain structure is adjacent the second side of the second gate stack, the drain structure over and in direct electrical contact with the TMD channel layer.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a two-dimensional (2D) material layer above a substrate;
a gate stack above the 2D material layer, the gate stack having a first side opposite a second side;
a semiconductor structure comprising germanium, the semiconductor structure laterally adjacent to and in contact with the 2D material layer adjacent the first side of the gate stack;
a first conductive structure adjacent the first side of the gate stack, the first conductive structure over and in direct electrical contact with the semiconductor structure, wherein the semiconductor structure is intervening between the first conductive structure and the 2D material layer; and
a second conductive structure adjacent the second side of the gate stack, the second conductive structure over and in direct electrical contact with the 2D material layer.

2. The integrated circuit structure of claim 1, wherein the semiconductor structure extends from a location below the 2D material layer to a location above the 2D material layer.

3. The integrated circuit structure of claim 1, wherein the semiconductor structure is a P-type semiconductor structure.

4. The integrated circuit structure of claim 1, wherein the gate stack comprises a high-k gate dielectric layer directly on the 2D material layer.

5. The integrated circuit structure of claim 1, wherein the 2D material layer comprises a sulfide material selected from the group consisting of molybdenum sulfide ($MoS_2$) and tungsten sulfide ($WS_2$).

6. The integrated circuit structure of claim 1, wherein the 2D material layer comprises a selenide material selected from the group consisting of molybdenum selenide ($MoSe_2$), tungsten selenide ($WSe_2$), and indium selenide (InSe), or comprises $MoTe_2$.

7. An integrated circuit structure, comprising:
a transition metal dichalcogenide (TMD) channel layer on an insulator layer on a silicon substrate;
a gate stack above the TMD channel layer, the gate stack having a first side opposite a second side, and the gate stack including a high-k gate dielectric layer directly on the TMD channel layer;
a structure comprising germanium and boron, the structure laterally adjacent to and in contact with the TMD channel layer adjacent the first side of the gate stack, the structure in a cavity in the insulator layer, and the structure on an N+ doped region of the silicon substrate;
a source structure adjacent the first side of the gate stack, the source structure over and in direct electrical contact with the structure comprising germanium and boron, but not in direct electrical contact with the TMD channel layer; and
a drain structure adjacent the second side of the gate stack, the drain structure over and in direct electrical contact with the TMD channel layer.

8. The integrated circuit structure of claim 7, wherein the structure comprising germanium and boron extends from a location below the TMD channel layer to a location above the TMD channel layer.

9. The integrated circuit structure of claim 7, wherein the TMD channel layer comprises a sulfide material selected from the group consisting of molybdenum sulfide ($MoS_2$) and tungsten sulfide ($WS_2$).

10. The integrated circuit structure of claim 7, wherein the TMD channel layer comprises a selenide material selected from the group consisting of molybdenum selenide ($MoSe_2$), tungsten selenide ($WSe_2$), and indium selenide (InSe), or comprises $MoTe_2$.

11. A computing device, comprising:
a board; and
a component coupled to the board, the component including an integrated circuit structure, comprising:
a two-dimensional (2D) material layer above a substrate;
a gate stack above the 2D material layer, the gate stack having a first side opposite a second side;
a semiconductor structure comprising germanium, the semiconductor structure laterally adjacent to and in contact with the 2D material layer adjacent the first side of the gate stack;
a first conductive structure adjacent the first side of the gate stack, the first conductive structure over and in direct electrical contact with the semiconductor structure, wherein the semiconductor structure is intervening between the first conductive structure and the 2D material layer; and
a second conductive structure adjacent the second side of the gate stack, the second conductive structure over and in direct electrical contact with the 2D material layer.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, wherein the component is a packaged integrated circuit die.

16. A computing device, comprising:
a board; and
a component coupled to the board, the component including an integrated circuit structure, comprising:
  a transition metal dichalcogenide (TMD) channel layer on an insulator layer on a silicon substrate;
  a gate stack above the TMD channel layer, the gate stack having a first side opposite a second side, and the gate stack including high-k gate dielectric layer directly on the TMD channel layer;
  a structure comprising germanium and boron, the structure laterally adjacent to and in contact with the TMD channel layer adjacent the first side of the gate stack, the structure in a cavity in the insulator layer, and the structure on an N+ doped region of the silicon substrate;
  a source structure adjacent the first side of the gate stack, the source structure over and in direct electrical contact with the structure, but not in direct electrical contact with the TMD channel layer; and
  a drain structure adjacent the second side of the gate stack, the drain structure over and in direct electrical contact with the TMD channel layer.

17. The computing device of claim 16, further comprising:
a memory coupled to the board.

18. The computing device of claim 16, further comprising:
a communication chip coupled to the board.

19. The computing device of claim 16, further comprising:
a camera coupled to the board.

20. The computing device of claim 16, wherein the component is a packaged integrated circuit die.

* * * * *